United States Patent [19]
Kaneoka

[11] Patent Number: 4,783,812
[45] Date of Patent: Nov. 8, 1988

[54] ELECTRONIC SOUND SYNTHESIZER

[75] Inventor: Yukio Kaneoka, Kyoto, Japan
[73] Assignee: Nintendo Co., Ltd., Kyoto, Japan

[21] Appl. No.: 893,341
[22] Filed: Aug. 5, 1986

[30] Foreign Application Priority Data

Aug. 5, 1985 [JP] Japan ................................ 60-172575
Oct. 28, 1985 [JP] Japan ........................... 60-166379[U]

[51] Int. Cl.⁴ ................................................ H03G 3/00
[52] U.S. Cl. ...................................... 381/61; 381/118; 84/1.01; 84/1.19
[58] Field of Search ....................... 84/1.01, 1.19, 1.22, 84/1.23, 1.26, 1.27; 381/61, 119

[56] References Cited

U.S. PATENT DOCUMENTS 4,301,704 11/1981 Nagai et al. .......................... 84/1.27
4,643,066 2/1987 Oya ..................................... 84/1.22

*Primary Examiner*—Forester W. Isen
*Attorney, Agent, or Firm*—Larry A. Jackson

[57] ABSTRACT

An electronic source synthesizer that employs frequency modulation. Wave-form data of both a fundamental wave and a modulated wave are stored in a RAM as 6-bit digital data. A sine wave signal is produced by modulation wave frequency data and the wave-form data from the RAM. The sine wave signal is multiplied with amplitude data of the modulation wave to obtain the modulation index data (J(t)). The frequency data ($w_c$) of the fundamental wave and the modulation index data are multiplied. A result of the multiplication provides a read out address of the RAM for storing the wave-form data of the fundamental wave, thereby changing the read out speed of the RAM. The digital data read out from the RAM is converted to an analog sound signal by a D/A converter. Amplitude data (A) of the fundamental wave is pulse-width modulated, and the digital data from the RAM is gated by the modulated pulse. Thus the output of the D/A converter is activated and, forms a sound signal represented by the equation $e=A \sin J(t)\, w_c t$.

14 Claims, 10 Drawing Sheets

OUTPUT OF
RAM 56
(DIGITAL VALVE)

OUTPUT OF
COMPERATOR 102

OUTPUT OF D/A
CONVERTER 106

OUTPUT OF
SOUND AMP
CCT 54

MODULATION INDEX

SOUND SIGNAL

SWEEP

MODULATION INDEX

SOUND SIGNAL

VIBRATO

MODULATION INDEX

SOUND SIGNAL

SWEEP+VIBRATO

ELECTRONIC SOUND SYNTHESIZER

BACKGROUND OF THE INVENTION

1. Field of the Invention

The present invention relates to an electronic source apparatus. More specifically, the present invention relates to a sound source synthesizer suitable for producing sound in an electronic game machine such as a television game machine using a video monitor.

2. Description of the Prior Art

The pertinent prior art relating to the present invention is disclosed in Japanese Patent Publication No. 33525/1979 issued Oct. 22, 1979. The prior art is a musical sound closely resembling the tone of musical instruments by using frequency modulation (FM) to induce time variation to the spectrum of the sound according to the kinds of musical instruments, such as brass or wood.

The prior art may be utilized efficaciously in keyed instruments to produce the musical sound equivalent to the various kinds of musical instruments.

In the electronic game machine such as the television game machine, it is necessary to produce sound to enhance the game and to interest the players. In one example of sound a constantly changing sound, hereinafter referred to as a sweep sound, is produced by continuously increasing or reducing the frequency.

However, in the above mentioned prior art, such a sweep sound could not be produced, for the following reason.

The musical sound signal (e) in the prior art may be given by the following equation:

$$e=A \sin [w_c t+I(t) \sin w_m t]$$

In the above equation, if the term I(t) sin $w_m$ t is integrated, the result will be $$\int_0^{\infty} I(t) \sin w_m t\, d t$$

which oscillates within the range of I(t) as the maximum and −I(t) as the minimum, resulting in a mean value of "0", thus a mean value of the musical sound signal (e) may be given as, $$e=A \sin w_c t.$$

Thus, in the prior art, the mean frequency is constant and the "sweep sound" described above can not be produced.

SUMMARY OF THE INVENTION

A principal object of the present invention is to provide an electronic source synthesizer that is capable of producing a sweep sound.

It is another object of the present invention to provide a sound source apparatus that is useful in producing sound in an electronic game machine.

It is a further object of the present invention to provide an electronic sound source synthesizer that is simple in circuit configuration and very low in cost. The present invention, in brief, involves an electronic sound source synthesizer comprising, a first memory means a wave-form data of a fundamental wave in a digital value, an operating means for obtaining the modulation index data (J(t)) which changes as a function of time based upon the modulation envelop data (B(t)), and a first multiplying means for multiplying the frequency data ($w_c$) of the fundamental wave and the modulation index data (J(t)). The multiplied result of the first multiplying means is given to the first memory means as the read out address, thereby changing the read out speed of the first memory means. The invention comprises a D/A converter means converting the digital value read out from the first memory means into an analog signal to output a sound signal (e).

In the first memory means, the wave-form data of the a fundamental sine wave for example, is stored. The modulation index data (J(t)) is obtained by the operating means on the basis of the modulation envelope data (B(t)). The first multiplying means multiplies the frequency data ($w_c$) fundamental wave and the modulation index data to output the data "J(t)·$w_c$t", thus determining the read out address of the first memory means. The read out speed from the first memory means is changed by the data "J(t)·$w_c$t". That is , the frequency modulation of the fundamental wave is affected by the modulation index data, which changes with time. The digital value read out from the first memory means is converted into the final sound signal (e) by the D/A converter.

In the present invention, the sound signal (e) is obtained according to the following equation (1).

$$e=A \sin J(t)\cdot w_c t \ldots \quad (1)$$

In equation (1), A indicates an amplitude of the fundamental wave, sin $w_c t$ indicates the fundamental wave, and the modulation index (J(t)) is given by the following equation (2).

$$J(t)=B(t)(C+\sin w_m t) \ldots \quad (2)$$

Here, B(t) represents the modulation envelop, C is the constant, and sin $w_m t$ represents the modulation wave.

According to the present invention, the frequency of sound signal is changed as a function of time by the frequency modulation. Because the integration of the modulated component of equation 1 will not result in "0", the "sweep sound" may be produced as sound in an electronic game machine. This was impossible in the prior art.

The embodiment of the present invention includes means for producing instantaneous amplitude data of the fundamental wave's envelop signal, means for outputting a time-width signal having the time width corresponding to the instantaneous amplitude, and means for activating the output of the D/A converter in response to the time-width signal.

The wave-form data is outputted in sequence from a wave-form data producing means such as an RAM or ROM, and the time-width corresponding to the instantaneous envelop amplitudes. The wave-form data is converted into the analog signal by the D/A converter.

The activating means, in one embodiment, gates the wave-form data from the wave-form data producing means to be applied to the D/C converter time-width signal. The output of the D/A converter is thereby activated during the time-width signal and smoothed into the musical sound signal.

In another embodiment, the fundamental wave data from the wave-form producing means is sent to the D/A converter as is, and the DC voltage applied to the D/A converter is turned on and off by the activating means.

In a further embodiment, the fundamental wave data from the wave-form data producing means is sent to the D/A converter as is, whose output is then applied to an analog switch. The output of the analog switch is then smoothed into the musical sound signal.

These and other objects, features and aspects of the present invention will become more apparent from the following detailed description of the embodiments of the present invention when read in conjunction with accompanying drawings.

DESCRIPTION OF THE PREFERRED EMBODIMENTS

Figure 1:
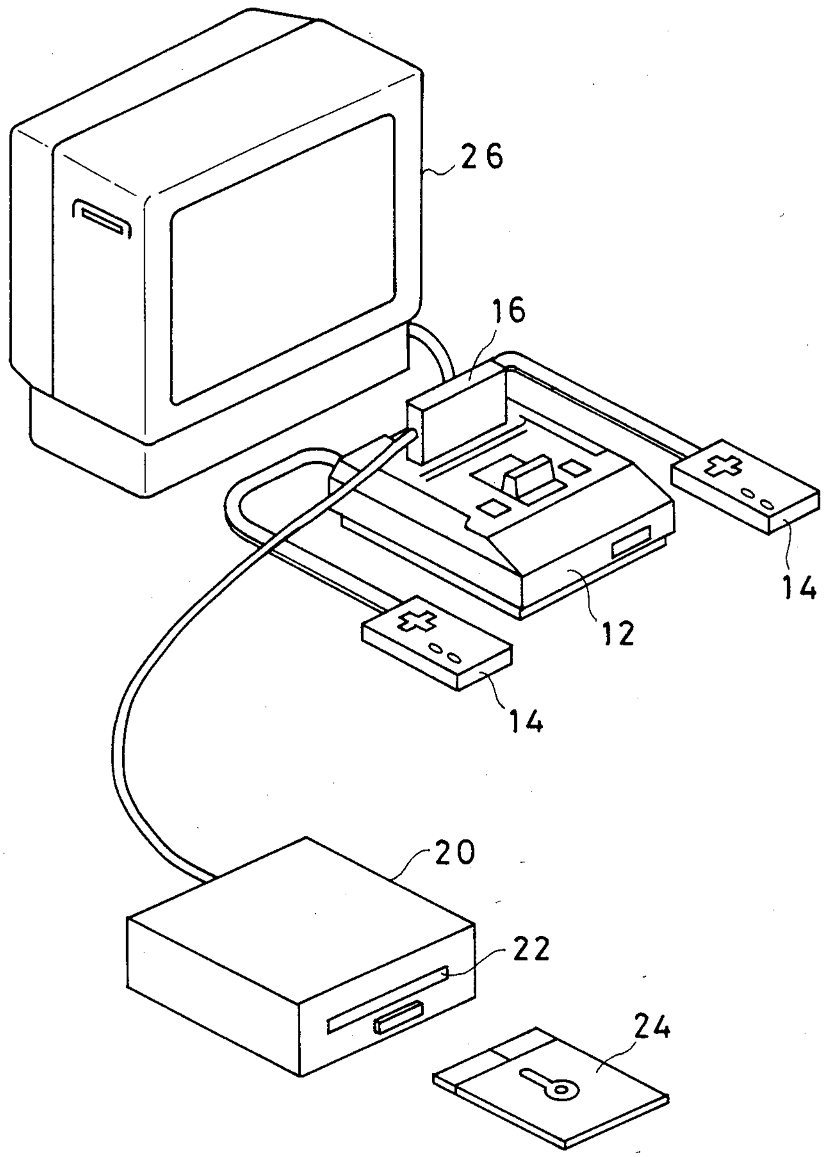
FIG. 1 is a schematic construction view showing one example of a video game system to which the present invention may be applied.

FIG. 1 is a schematic construction view showing one example of a video game system to which the present invention may be applied. The case where the present invention is applied to a video game system will be explained. The present invention may be used as a sound source apparatus for other electronic equipment as well.

A commercial power source is applied through an AC adapter, not shown, to a main unit 12 of the game machine. Two controllers 14 are connected to the main unit 12 by suitable connecting cables. The main unit 12 is connected to an adapter 16 that is, in turn, connected to a data input device 20. An opening 22 for inserting a floppy disk is formed on the data input device 20.

As the main unit 12, a "Family Computer" (trademark) manufactured and marketed by the assignee of the present invention, may be utilized.

In response to the data written onto the floppy disk 24 in advance, data for the game is given to the main unit 12 from the data input device 20 via the adapter 16. Thus, from the main unit 12, a TV signal for executing the game corresponding to the content of the floppy disk 24 is outputted to an antenna terminal, not shown, of a TV receiver 26.

In such a video game system, the player can enjoy the vidoo game by operating the controller 14 to control the game character on the display screen of the TV receiver 26.

Figure 2:
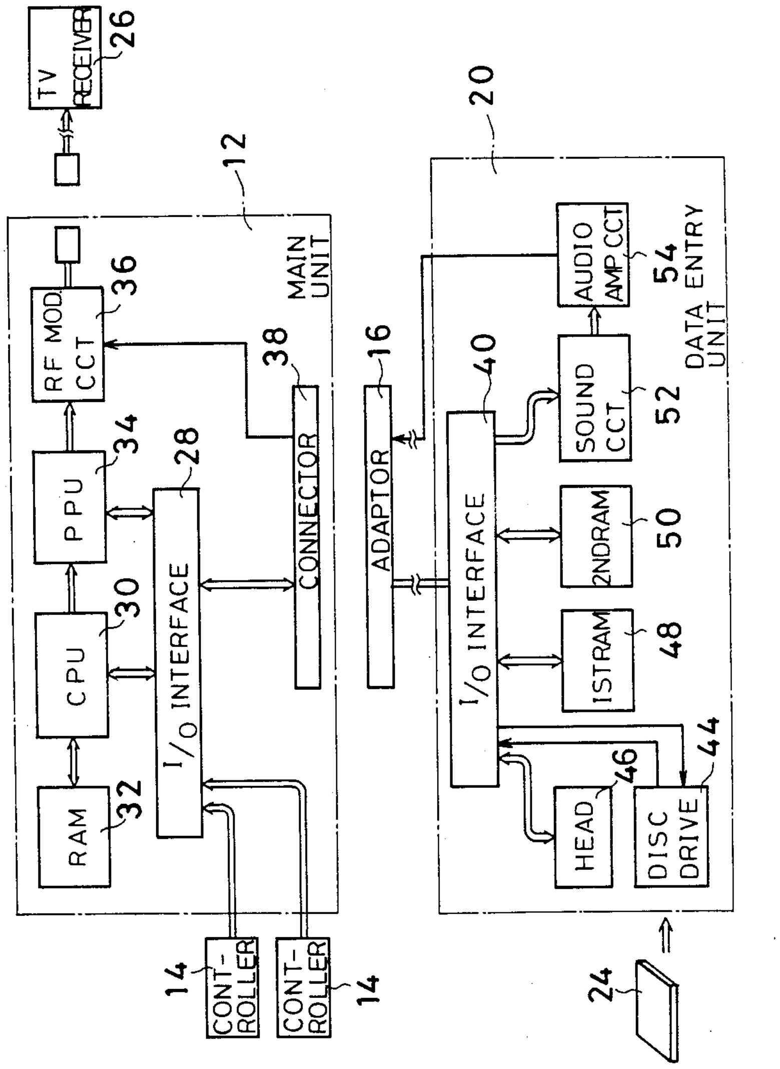
FIG. 2 is a block diagram showing the system of FIG. 1

FIG. 2 is a block diagram showing a system configuration of FIG. 1. The controller 14 is connected to the main unit 12, and the signal from the controller 14 is given to a CPU 30 through the I/O interface 28. Connected to the CPU 30 is a RAM 32 for storing various controlling data as well as a PPU 34 for receiving the image data from the CPU 30. For the CPU 30 a microprocessor such as an integrated circuit "2A02" by Nintendo may be used. The PPU 34 is designed to produce the image signal for the game on the basis of the image data from the CPU 30. For the PPU 34 an integrated circuit "2C03" by Nintendo may be utilized, a detail of which is disclosed on the specification of a patent application with the Ser. No. 564,091 filed on Dec. 21, 1983.

The image signal from the PPU 34 is converted into a TV signal of NTSC standard by an RF modulation circuit 36, and fed to the antenna terminal of the TV receiver 26 via a coaxial cable.

On the main unit 12, a connector 38 for connecting the adapter 16 is provided. The CPU 30, through the connector 38, exchanges data with the adapter 16 and thus with the data input device 20 via the I/O interface 28.

The data input device 20 includes an I/O interface 40 connected to the adapter 16. Within the insertion opening 22 of the data input device 20, there is a disk drive 44 and a head 46. From the disk drive 44, the floppy disk insertion detecting signal is transmitted through the I/O interface 40 to the CPU 30 incorporated in the main unit 12. Various command signals are given from the CPU 30 to the disk drive 44. The data read by the head 46 is fed to the CPU 30 included in the main unit 12 via the I/O interface 40, to which a first RAM 48 and a second RAM 50 are connected. To these first and second RAMs 48 and 50, under the control of CPU 30 of the main unit 12, data, read from the floppy disk 24 by the head 46, is written according to the memory map shown in FIG. 4. The sound control program **24*a*, sound source data 24*b*, game control program 24*c* and game display data 24*d* have been written onto the floppy disk 24 in advance according to the contents of the game, and are now read by the head 46. The sound control program 24*a*, sound source data 24*b* and game control program 24*c* are written into a fixed address of the first RAM 48, while the game display data 24*d* is written into the second RAM 50**.

In the data input device 20, a sound source circuit 52 is connected to the I/O interface 40 and to the main unit 12 of the present invention. The sound source circuit 52 is designed to produce the sound signal (e) on the basis of the sound source data written in the first RAM 48, described later with reference to FIG. 3. The sound signal from the sound source circuit 52 is amplified by an audio amplifying circuit 54, and transmitted to the RF modulation circuit 36 of the main unit 12 through the adapter 16 and the connector 38. In the RF modulation circuit 36, the image signal for the game and the sound signal from the audio amplifying circuit 54 are processed to produce the TV signal, for example, of NTSC standard.

Figure 4:
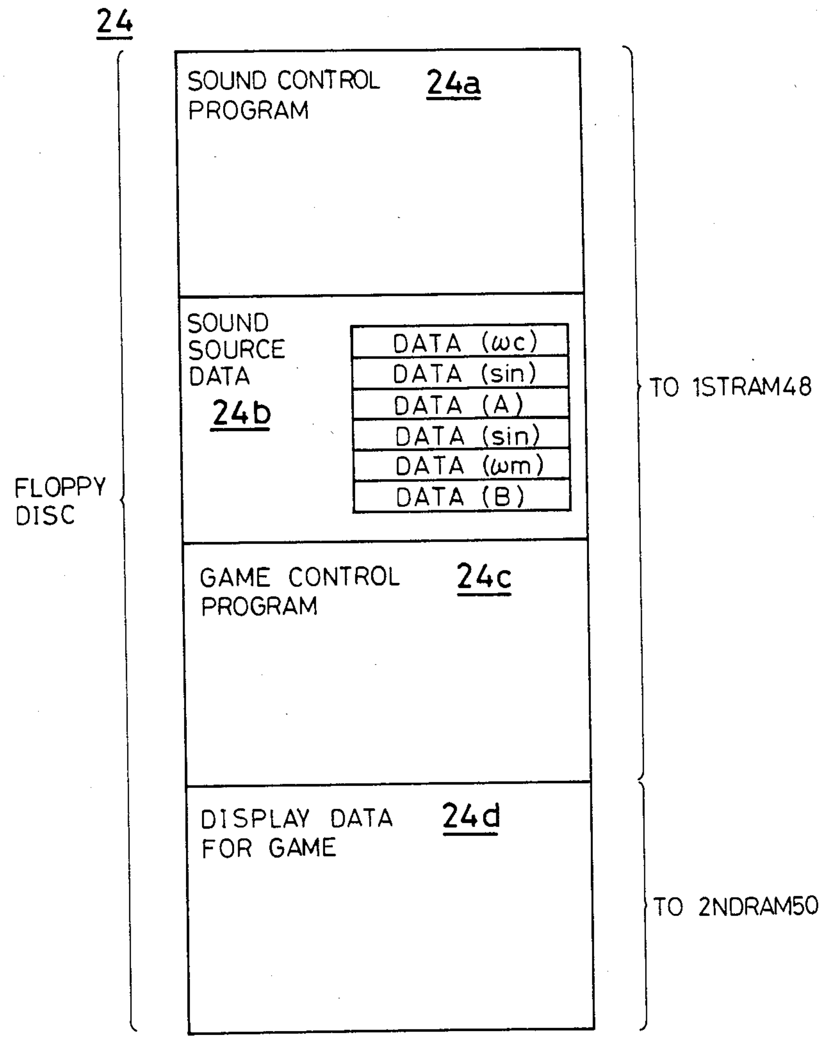
FIG. 4 is a schematic view showing a memory map of the embodiment of FIG. 2.

Referring to the operation of the system shown in FIG. 2, initially the floppy disk 24 is inserted into data input device 20. The disk drive 44 detects the insertion, and the detection signal is sent via the I/O interface, adapter 16, connector 38 and I/O interface 28 to the CPU 30. The CPU 30, in turn, gives the drive command to the disk drive 44 through the reverse path. The floppy disk 24 is then driven by the disk drive 44. The head 46 reads the program and data 24a–24d, as shown in FIG. 4, from the floppy disk. The program and data are stored temporarily in the RAM 32 of the main unit 12 via the CPU 30 through the same path. The CPU 30 writes the program and data stored in the RAM 32 into the fixed address of RAM 48 and 50, respectively, of the data input device 20. The game program and data from the floppy disk 24 and are now stored in the first and second RAMs 48 and 50.

When the controller 14 is operated by the player, the n signal is transmitted through the I/O interface 28 to the CPU 30. On the basis of the signal from the controller 14, the data stored in the first and second RAMs 48 and 50 is processed by the CPU 30. The CPU 30 transmits the image data corresponding to the game condition of that moment to the PPU 34. The PPU 34 converts the image data into the image signal. The sound source circuit 52, receives the sound source data 24b from the first RAM 48 via the I/O interface 40 and produces and amplifies the sound signal before feeding it to the RF modulation circuit 36.

The TV signal of NTSC standard is outputted from the RF modulation circuit 36, to allow background and game characters to be displayed on the TV receiver 26. The game characters on the display screen may be freely moved or changed by operating the controller 14.

The sound necessary for the game system are thus produced by the sound source circuit 52.

Figure 3:
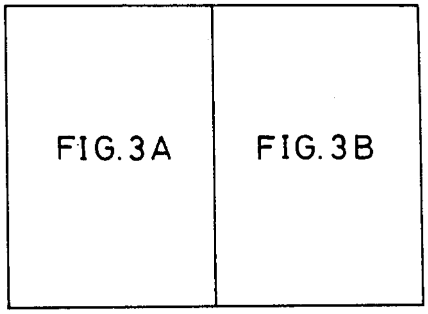
FIG. 3 is a block diagram showing one embodiment in accordance with the present invention.

FIG. 3 is a block diagram showing one embodiment in accordance with the present invention. The sound source circuit 52 includes a RAM 56 as a first memory means for storing the wave-form data of a fundamental wave to be modulated. Into the RAM 56, the wave-form data of the fundamental wave, such as sine wave data (sin), is written from the CPU 30 according to a write address WAD. The waveform data of the fundamental wave is 6-bit data indicating the amplitude value sampled periodically by dividing, for example, one cycle of the sine wave into 64(T/64). Therefore, the RAM 56 includes the area of 64 by 6 bits.

As the wave-form of the fundamental wave and wave-form, data of the fundamental wave is 6-bit data indicating the amplitude value sampled periodically by dividing, for example, one cycle of the sine wave into 64(T/64). the RAM 56 includes the area of 64 by 6 bits.

As the wave-form of the fundamental wave any wave-form, such as a cosine wave, triangular wave, or saw-tooth wave, may be used instead of the sine wave.

A fundamental wave frequency data register 58, for receiving frequency data of the fundamental wave from the CPU 30, is employed. From the fundamental wave frequency data register , data of fundamental wave frequency ($w_c$) is outputted. The data from the fundamental wave frequency register 58 is sent to a 19-bit shift register 60. To the shift register 60, a clocksignal CL for example, of 1 μsec., shift signal from the clock source 62, and the output from a frequency divider 64 dividing the clock signal by ⅛ is fed as a load signal to register 60. When the load signal is applied, the 12-bit data from the fundamental wave frequency data register 58 is loaded into the shift register 60 at its lower 12 bits. Simultaneously, the upper seven bits of the shift register 60 are loaded with "0". Thereafter, each bit is shifted to the left at every one clock, so that at the n-th clock, the data of fundamental wave frequency data ($w_c$) multiplied by $2^n$ are loaded on the shift register 60. However, since the load command signal from the frequency divider 64 is given at every eight clock signals, "n" is the value of "0 to 7".

The 19-bit data from the shift register 60 is sent to the lower 19 bits of one input of a full adder 66. The upper 5 bits of the full adder 66 are fed with "0", and the 24-bit output of a latch circuit 68 is sent to the other input of the full adder 66. Thus, the full adder 66 is constructed as a 24-bit full adder.

The output of 24 bits of the full adder 66 is transmitted to the latch circuit 68 having the same number of bits. The signal instructing the latching operation is sent from an AND gate 90 rate as the signals from the clock source 62. A first multiplying means for multiplying the fundamental wave frequency ($w_c$) and the modulation index (J(t)) to output the data $J(t)\cdot w_c t$" is constructed by the shift register 60, full adder 66 and latch circuit 68. The upper six bits of the latch circuit 68 is given as a read out address RAD of the RAM 56.

In the RAM 56, which stores the wave-form data of the fundamental wave, the wave-form is converted (in this embodiment by sine conversion) to output the wave-form data of the fundamental wave, sin $w_c t$. However, in practice, because the latch circuit 68 forms the first multiplying means, a signal represented by (sin $w_c t\cdot J(t)$) is outputted.

The circuit producing the modulation index (J (t)) will be explained as follows. A RAM 70 for storing the modulation wave-form data is employed as a second memory means, into which the wave-form data of the modulation wave, such as the sine data (sin), is written from write address WAD of the CPU 30. As the fundamental wave-form data, the modulation wave-form data is the 6-bit data indicating the amplitude value sampled periodically by dividing, for example, one cycle of the sine wave into 64 (T/64). Therefore, the RAM 70 includes the area of 64 by 6 bits. The modulation wave is not necessarily limited to the sine wave and may be a triangular wave, saw-tooth wave, or cosine wave.

For receiving the modulation frequency data ($w_m$) from the CPU 30, a modulation frequency data register 72 is provided. The 12-bit modulation frequency data from the register 72 is applied to the lower 12 bits of one input of a 17 bit full adder 74, while the upper 5 bits are fed with "0". To the other input of the full adder 74, 17-bit data is provided from the latch circuit 76, which receives the latch signal from the frequency divider 64. The added result from the full adder 74 is sent to the latch circuit 76 as 17-bit data. The upper 6 bits of the latch circuit 76 are sent as the read out address RAD of the RAM 70 for storing the modulation wave-form data previously described.

Thus, in the RAM 70 which stores the modulation wave-form data, the wave form is converted (in this embodiment sine conversion) to output the modulation wave-form data sin $w_m T$.

A modulation amplitude data register 78 is provided to receive the modulation wave amplitude data (B), representing the modulation wave amplitude in 6-bit data, from the CPU 30. The data from the modulation amplitude data register 78 is applied to a reversible counter 80. The I/D signal, which indicates whether an increment or decrement is received from the CPU 30, and the count input from a programmable frequency divider 82 are sent to the reversible counter. The programmable frequency divider 82 divides the clock, a 1 msec. clock source 84, by a suitable frequency division ratio provided by the CPU 30. Therefore, by changing the modulation amplitude data (B), frequency division ratio, and I/D signal from the CPU 30, the modulation envelope data (B(t)) can change its amplitude through reversible counter 80.

The modulation wave data (sin $w_m t$) converted in the RAM 70 and the modulation envelope data (B(t)) from the reversible counter 80 are applied as two inputs to a multiplier 86. The multiplier 86 multiplies the two inputs and outputs the modulation index data (J(t)) represented by the previous equation (2).

The modulation index data (J(t)) is given to an 8-bit shift register 88. The 1 μsec. clock from the clock oscillator 62 is provided to the shift register 88 as the right shifting clock, and the signal from the frequency divider 64 is fed as the load signal. The least significant bit of the shift register 88 is applied to one input of the AND gate 90, and the 1 μsec. clock signal sent is to the other input. The output of the AND gate 90 is transmitted as the latch command to the latch circuit 68. When the least significant bit of the shift register 88 is "1", "1" is outputted from the AND gate 90 in response to the clock, and the latch circuit 68 is thus instructed to latch.

A fundamental wave amplitude data register 92 is provided to receive the amplitude data (A) of the fundamental wave from the CPU 30. The amplitude data (A) represents the fundamental wave amplitude in 6-bit data, and this data is given to a reversible counter 94. The reversible counter 94, like the previous reversible counter 80, receives the output of a programmable frequency divider 98, which has received a clock signal from a 1 msec. clock source 96. The reversible counter 80 also receives the I/D signal 30 which controls the increment or decrement designation. A suitable frequency division ratio is set in the programmable frequency divider 98 from the CPU 30. From the reversible counter 94, the fundamental wave envelope data (A(t)) changing amplitude with time, like the previous modulation envelope data, is outputted.

The 6-bit fundamental wave envelope data from the reversible counter 94 is sent to one input of a comparator 102. To the other input of the comparator 102, a 6-bit output of a counter 100, incremented at every 0.5 μsec., is provided. The comparator 102 outputs the pulse signal which rises to a high level when the data from the reversible counter 94, i.e., the fundamental envelope data (A(t)), is larger or the same as the data from the counter 100, and droops to a low level when the data from the reversible counter 94 is less than the data form the counter 100.

The pulse output from the comparator 102 is transmitted to one input of the AND gates 104*a*–104*g*. To the other input of these AND gates 104*a*–104*g*, the bit data from RAM 56 is provided. The AND gates 104*a*–104*g* send the output of the RAM 56 to a D/A converter 106 when the output from the comparator 102 is at a high level, that is when the data of the reversible counter 94 is larger or the same as data of the counter 100. Thus, by AND gates 104*a*–104*g*, the signal "sin J(t)·$w_c t$" from the RAM 56 is pulse-width modulated.

Now, a description is provided of the operation of the embodiment of FIG. 3. In the embodiment, a final sound signal is obtained from the D/A converter 106, which is represented by the equation (1). The fundamental wave envelope (A(t)) is transmitted from the reversible counter 94 and the modulation index (J(t)) is transmitted from the multiplier 86. The fundamental wave frequency data ($w_c t$) is obtained from the shift register 60. From the latch circuit 68, the data "J(t)·$w_c t$" is outputted. The read out address of the RAM 56 is thus determined, from which the signal "sin J(t)·$w_c t$" is then outputted. Then, the pulse-width modulation is performed by the AND gates 104*a*–104*g* and the final sound signal (e) represented by the equation (1) is obtained.

In the shift register 60 associated with fundamental wave, the fundamental wave frequency data ($w_c$) is loaded to its lower 12 bits and the "0" is loaded to its upper 5 bits by the load signal from the frequency divider 64, and, at every 1 μsec., clock signals from the clock generator 62 shift to the left. In the shift register 60, the fundamental wave frequency data ($w_c$) is multiplied by $2^0$, $2^1$, $2^7$ at every rising edge of clock. The latch signal from the AND gate 90 is outputted at each falling edge of clock accordance with the content of the least significant bit of the shift register 88, "0" or "1".

The fundamental wave frequency data ($w_c$) is loaded to the shift register 60 at the rising edge of the first clock signal CL. If the least significant bit of the shift register 88 is "1" at the falling edge of the first clock signal, the data is latched by the latch circuit 68. Then the left shift is effected in the shift register 60 at the rising edge of the second clock signal. Thus, the least significant bit of the shift register 60 is turned to "0" and the data ($w_c$) previously loaded is doubled. At the same time, the shift register 88 is shifted to the right and the second to the last bit data is sent to the least significant bit. The doubled data of the shift register 60 is latched by the latch circuit 68 in response to the latch signal from the AND gate 90 outputted at the falling edge of the second clock signal when the least significant bit of the shift register 88 equals "1".

The upper 6 bits of the latch circuit 68 are utilized as the read out address of the RAM 56. If the content of the latch circuit 68 is "000—" at the first state, "J(t)·$w_c t$" is latched at the falling edge of the 8-th clock. Thus, the read out address of the RAM 56 is changed by "1" at every 8 μsec./2, or about 4 μsec. at the maximum The modulation frequency data ($w_m$) is altered based on the sequence $w_m$, $2w_m$, $3w_m$, by the full adder 74 every 8 μsec. in the latch circuit 76. The latch circuits upper 6 bits are used as the read out address of the RAM 70. Therefore, the changing amount of the upper 6 bits of the latch circuit 76 (read out address of RAM 70 for storing the modulation wave-form data) serves as the modulation frequency data ($w_m t$) which determines the modulation wave changing period or vibrato period. The vibrato period becomes larger as the changing amount ($\Delta w_m t$) of the latch circuit 76 becomes smaller.

The sine wave data (sin $w_m t$), converted by the changing modulation frequency data, is outputted from the RAM 70 to store the modulation wave-form data.

The modulation wave envelope data (B(t) is obtained by the modulation amplitude data register 78 and the reversible counter 80. Therefore, the modulation index (J(t), provided in equation (2), is obtained from the multiplier 86.

Figure 5A:
FIGS. 5A through 5D are wave-form diagrams showing a part of operation of the embodiment of FIG. 3.
Figure 5B:
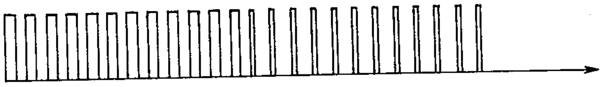
Figure 5C:
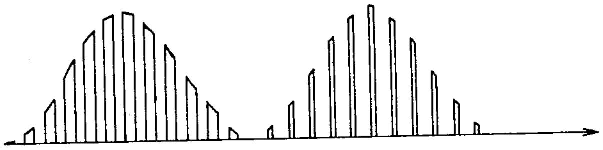
Figure 5D:
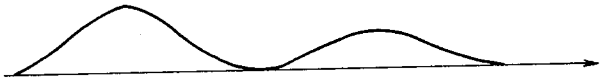

As is shown in FIG. 5A, the sine wave component (sin J(t)·$w_c t$) is outputted from the RAM 56 to store the fundamental wave-form data. As is shown in FIG. 5B, the pulse signal is outputted from the comparator 102 according to the comparison of the two counters 94 and 100. The output from the RAM 56 shown in FIG. 5A is gated by AND gates 104*a*–104*b* with the pulse signal shown in FIG. 5B. The sound signal (e) having the wave form shown in FIG. 5C is obtained from the D/A converter 106. The sound signal is then turned into the integrated wave form, as is shown in FIG. 5D., and the following equation, by passing through the audio amplitude circuit 54 (FIG. 2).

$$e = A \sin \Sigma\{B(n)(C + \sin w_m n) w_c + w_c\} \ldots \quad (3)$$

In the above equation (3), if the modulation frequency data ($w_m$) is "0", sin $w_m t = 0$, thus the equation (3) may be changed into the following equation (4), $$e = A \sin \Sigma\{B(n)(C) w_c + w_c\} \ldots \quad (4)$$

Figure 6A:
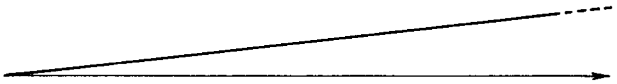
FIGS. 6A, 6B, 7A, 7B, 8A and 8B are wave-form diagrams showing the different operations of the embodiment of FIG. 3, in which part (A) shows a modulation index and part (B) shows a sound signal being obtained.
Figure 6B:
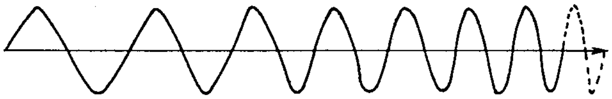

By making the modulation envelope a simple increasing or decreasing function, as is shown in FIG. 6A, the "sweep sound" increases or decreases, and a continuous sound signal frequency or sound pitch may be produced as is shown in FIG. 6B In the previous equation (3), if the constant C=0, the equation may be changed to the following equation (5).

$$e = A \sin \Sigma\{B(n)(\sin w_m n) w_c + w_c)\} \ldots \quad (5)$$

Figure 7A:
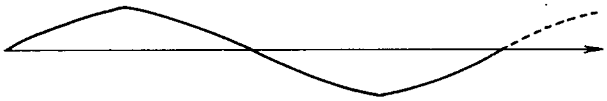
Figure 7B:
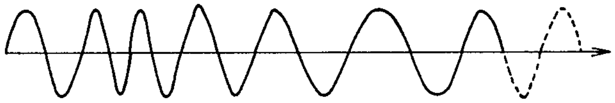

Thus, as is shown in FIG. 7A, the modulation index J(t) changes in the positive and negative directions about "0". As is shown in FIG. 7B, the sound signal obtained changes its frequency at $f_m = w_m/2\pi$ about the frequency of $f_c = w_c/2\pi$, showing a so-called vibrato effect.

Figure 8A:
Figure 8B:
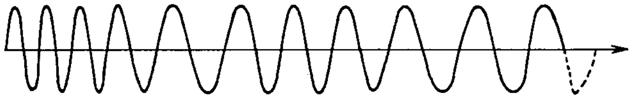

Now, by determining both the constant C and the modulation frequency data ($w_m$) in the aforementioned equation (1) at a value other than "0", and setting the modulation envelope data (B(t)) as a simple increasing and decreasing function, the modulation indexes of FIG. 6A and FIG. 7A tend to be synthesized. In this case, as is shown in FIG. 8B, a very peculiar sound signal, vibrating and changing its center frequency, is obtained. This sound signal is impossible to produce with the prior art.

Figure 9:
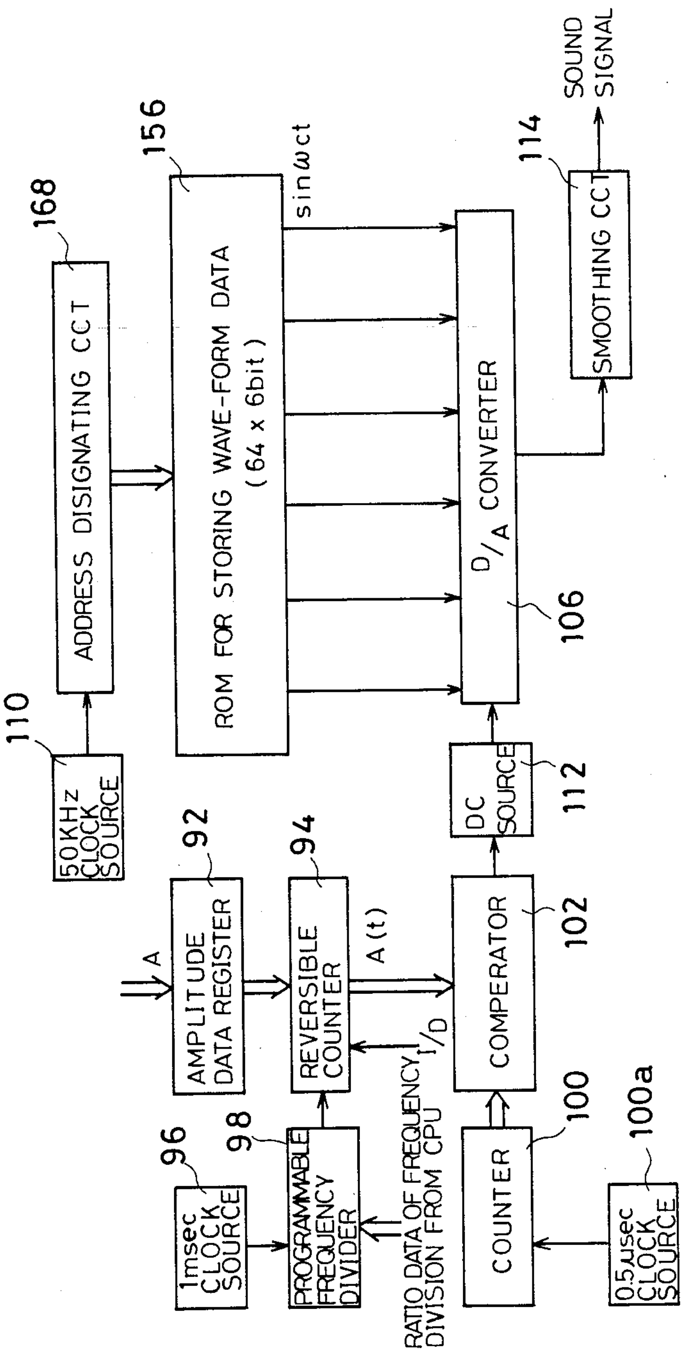
FIG. 9 is a block diagram showing a major portion of another embodiment in accordance with the present invention.

FIG. 9 is a block diagram showing a major portion of another embodiment in accordance with the present invention. This embodiment is the modification of the circuit portion including the circuit components 56, 92 through 102, 104a–104g and 106. A ROM 156 for storing the wave-form data is provided. The ROM 156 corresponds to the RAM 56 in the embodiment of FIG. 3 by possessing an address having 64 by 6 bits, in which the data indicating the sine-wave wave-form component is written into respective address in advance as 6-bit data representing the amplitude value, which is sampled periodically by dividing one cycle into 64.

Instead of the sine wave, any wave form, such as a cosine wave, triangular wave, saw-tooth wave or the like may be used for the required sound.

The ROM 156 for storing the wave-form data is addressed in sequence by an addressing circuit 168 which includes an address counter. The addressing circuit 168 corresponds to the latch circuit 68 in the previous embodiment. A clock signal having a frequency of , for example, 50 KHz from a clock source 110 is provided to the addressing circuit 168. Therefore, the address in the addressing circuit 168 is incremented or decremented at every 0.02 m sec. ($=1/50\times10^3$). Due to the addressing by the addressing circuit 168, the wave-form data is read out in sequence from the ROM 156 as 6-bit data. The outputs of the respective bits of the ROM 156 represent the sine-wave form data sin w. The frequency of the wave-form component read out is 0.781 KHz (=50 KHz/64) in the embodiment.

In the embodiment of FIG. 3, the AND gates 104a–104g are utilized to activate the out put of the D/A converter 106 based on the time-width signal, or the pulse signal form the comparator 102. In the embodiment of FIG. 9, the DC voltage applied to the D/A converter 106 is turned on or off based on the output of the comparator 102. The respective bit outputs of the ROM 156 are transmitted to the D/A converter 106 as is, and the pulse signal from the comparator 102 is sent to the DC power supply 112. The DC power supply 112 applies the DC voltage to the D/A converter 106 when the pulse signal received is at a high level, and turns off the DC voltage when the pulse signal is at a low level. Thus, the sine wave sound signal (e) is obtained from a smoothing circuit 114 as in the previous embodiment, but by turning the DC voltage 112 on and off based upon the output from the comparator 102.

Figure 10:
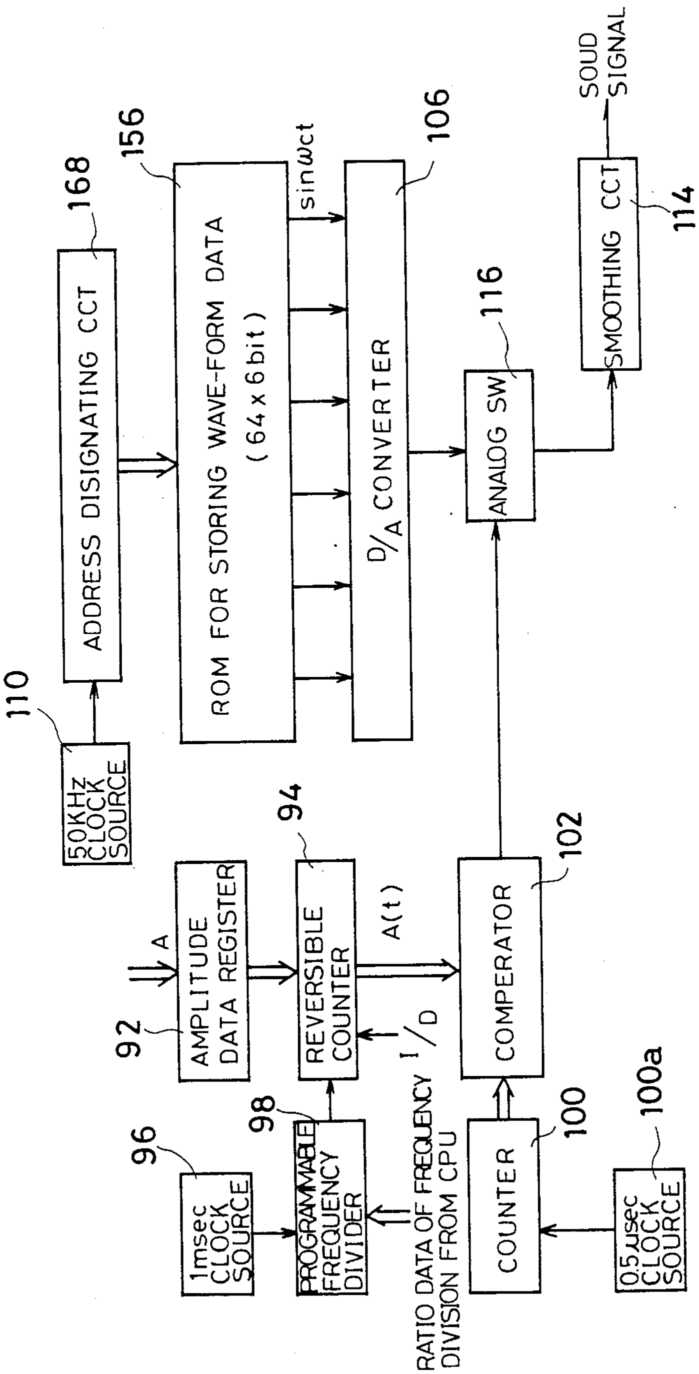
FIG. 10 is a block diagram showing a major portion of a further embodiment in accordance with the present invention.

FIG. 10 is a block diagram showing a major portion of a furter embodiment in accordance with the present invention. In the embodiment, the respective bit outputs of the ROM 156 are provided to the D/A converter 106 as is, the output of which is sent to the iput of an analog switch 116. The analog switch 116 receives the time-width signal, or the pulse signal, from the comparator 102. Therefore, the analog switch 116 sends the analog output received from the D/A converter 106 to the smoothing circuit 114 based upon the pulse signal received. The analog switch 116 acts upon the output received from the D/A converter 106 based upon the pulse signal from the comparator 102.

In the embodiments of FIGS. 9 and 10, the frequency of the clock source 110, and thus the frequency of the sound signal obtained from the smoothlng circuit 114, has been described as the fixed frequency. The frequency, however, may be changed according to the embodiment of FIG. 3 based upon the sound pitch.

Figure 11:
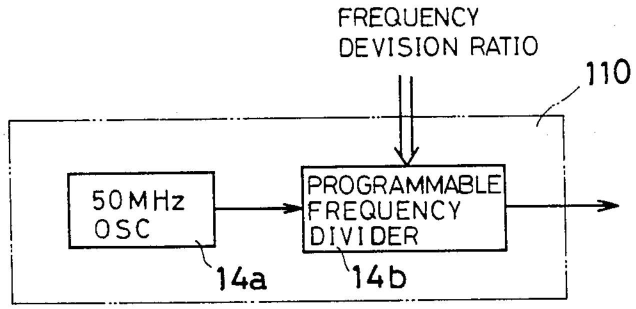
FIG. 11 a block diagram showing a major portion of the other embodiment in accordance with the present invention.
Figure 3A:
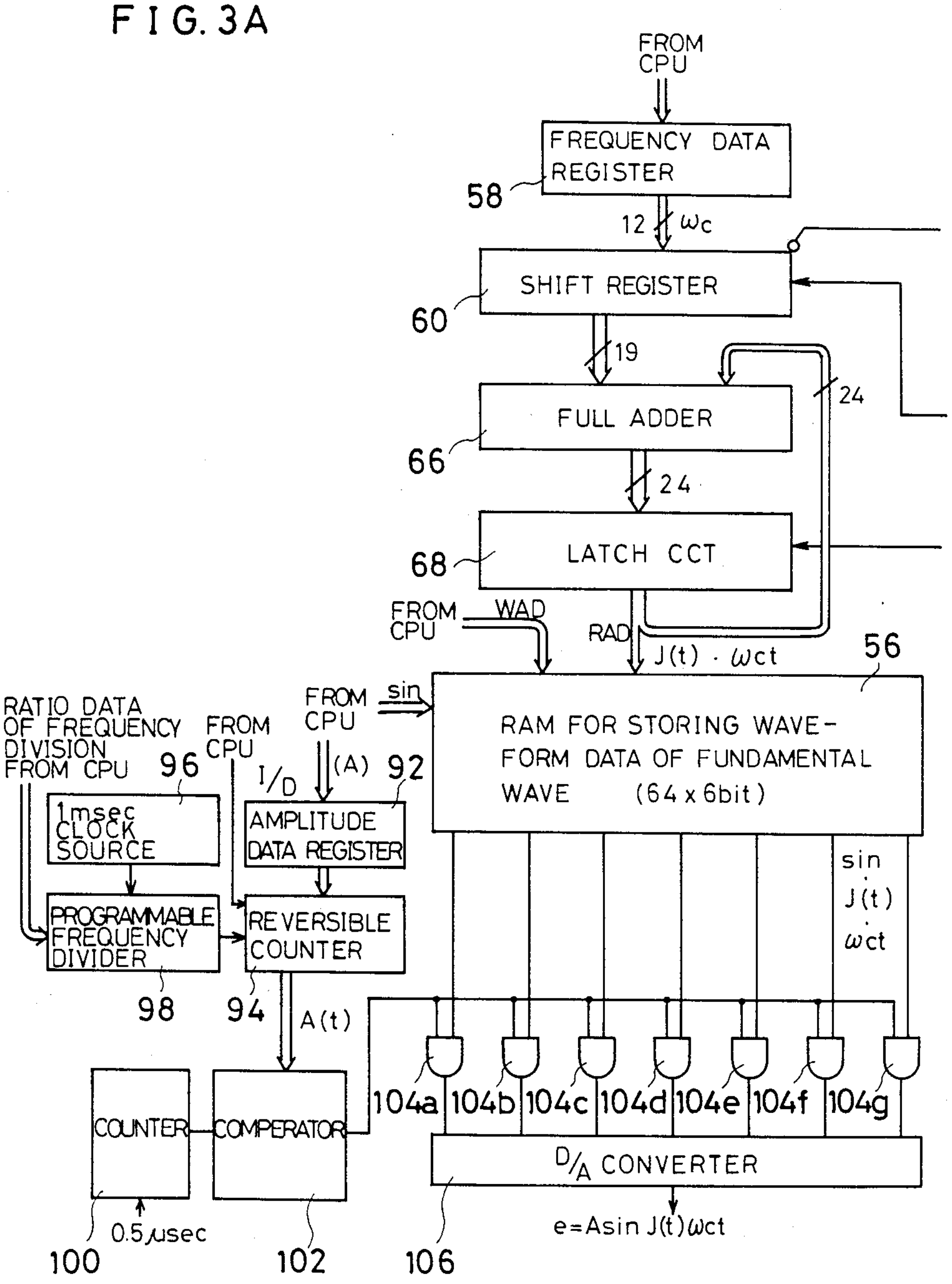
Figure 3B:
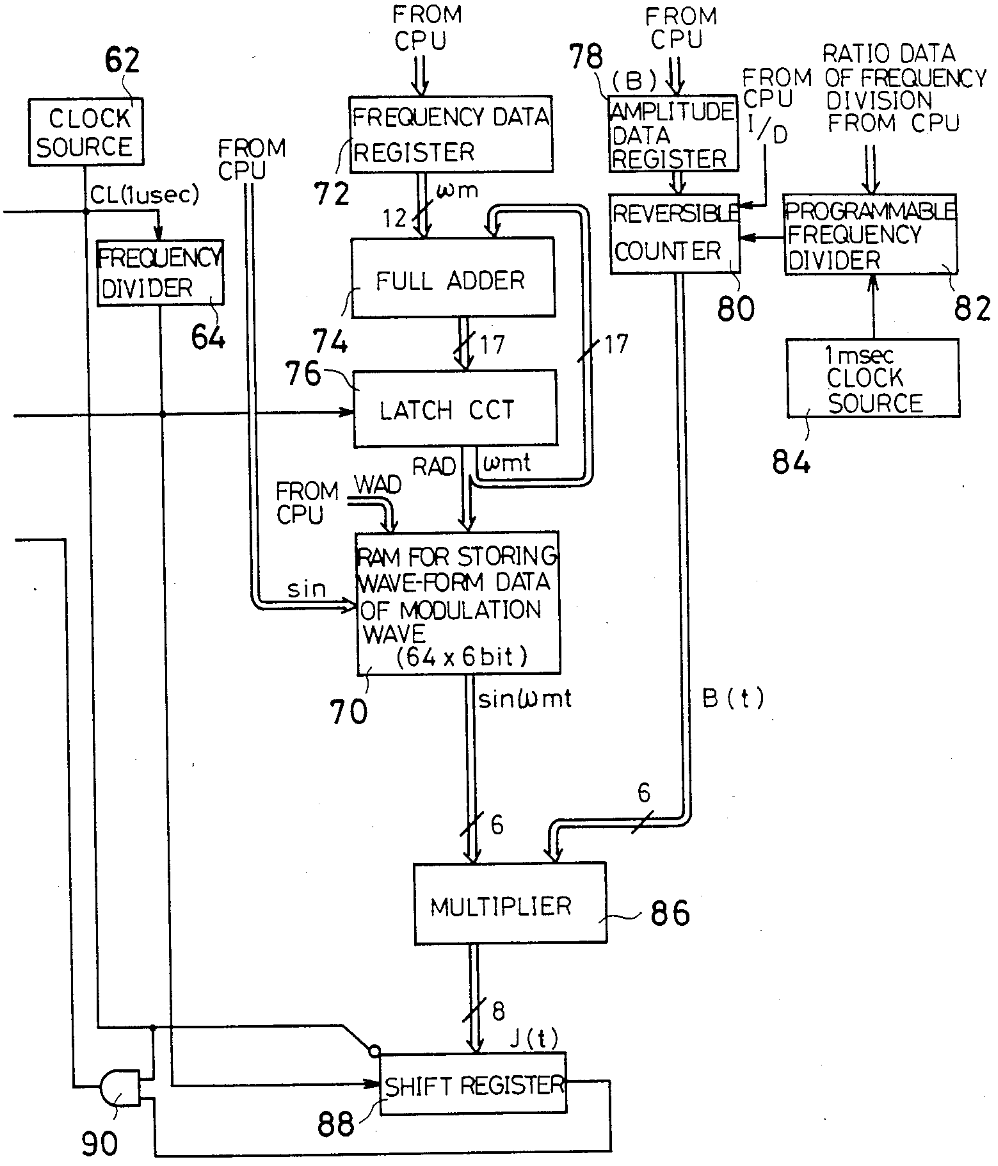

FIG. 11 is block diagram showing another configuration for changing frequency. In the embodiment, the clock source 110 includes a 50 MHZ oscillator 110a and a programmable frequency divider 110b that receives the output of the clock source 110. From the CPU 30 (FIG. 2), a suitable frequency division ratio is set in the programmable frequency divider 110b according to the necessary sound pitch. Corresponding to the frequency division ratio set, the 50 MHz signal from the oscillator 110a is divided and transmitted to the addressing circuit 168. The addressing circuit 168 selects the address of the ROM 158 at the speed relating to the frequency division ratio set in the programmable frequency divider 110b. The wave-form component read out from the ROM 156, or the sound signal frequency (sound pitch) obtained from the smoothing circuit 114, may thus be changed.

As in the embodiment of FIG. 3, a RAM memory means may be used instead of the ROM 156 for storing wave-form data in the embodiments of FIGS. 9 and 10.

In the above embodiment, the floppy disk 24 (FIG. 1) was used as a sound source data setting means. However, another memory means such as a ROM cartridge or a memory means set in the inner ROM fixedly may be used.

In the embodiment described above, circuits which are discrete and interconnected are used. However, the software processing by one or two or more CPU's is possible except for the processing of the D/A converter 106.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic sound source apparatus comprising;

a first addressable memory means for storing fundamental wave wave-form data as a digital value, an operating means for producing a modulation index $(J(t) < B(t)\ (C+\text{Sin}\ w_m t)$ that changes with time according to modulation envelope data and modulation wave wave-form data $w_m t$, and wherein C is a constant, a first multiplying means for multiplying fundamental wave frequency data ($w_c$) and said modulation index data J(t), and means for applying the multiplied result of said first multiplying means to said first memory means as read out address data, thereby changing a rate at which said fundamental wave wave-form data is read out of said first memory means, and further comprising:

a D/A converting means for converting the digital value read out from said first memory means into an analog signal to produce a sound signal ($e = \text{Sin}\ J(t) \cdot w_c t$).

2. An electronic sound source apparatus in accordance with claim 1, wherein said operating means includes a second multiplying means that produces said modulation index data (J(t)) based upon a modulation wave wave-form data of modulating frequency ($w_m$) and said modulation envelope data.

3. An electronic sound source apparatus in accordance with claim 2, wherein said operating means includes a second memory means for storing said modulation wave wave-form data as a digital value, said modulation wave wave-form data being read out from said second memory means according to said modulation frequency ($w_m$) and then being applied to said second multiplying means.

4. An electronic sound source apparatus in accordance with claim 1, which further comprises means for providing a fundamental wave envelope data (A(t)), and changing means for varying said rate at which said fundamental wave wave-form data is read out of said first memory means on the basis of said fundamental envelope data (A(t)), such that the amplitude of the output sound signal from said D/A converting means is altered based upon said rate.

5. An electronic sound source apparatus in accordance with claim 4, wherein said changing means includes a means for outputting a pulse signal having a duration correlated with said fundamental wave envelope data, and a gate means for gating the output of said first memory means by said pulse signal.

6. An electronic sound source apparatus in accordance with claim 1, which further comprises means for providing said fundamental wave envelope data (A(t)), means for outputting a time-width signal having a time width corresponding to said fundamental wave amplitude, and an activating means for activating the output of said D/A converting means in response to said time-width signal.

7. An electronic sound source apparatus in accordance with claim 6, wherein said activating means includes means for gating the fundamental wave wave-form data of said first memory means by said time-width signal.

8. An electronic sound source apparatus in accordance with claim 7, which further comprises a power source for applying a DC voltage to said D/A converting means, wherein said activating means includes means for activating and deactivating said power source in response to said time-width signal.

9. A sound source apparatus for electronic equipment in accordance with claim 7, wherein said activating means includes an analog switch which receives the output of said D/A converting means, and is controlled by said time-width signal.

10. An electronic sound source apparatus in accordance with claim 1, which further comprises a main unit containing said first memory means, operating means, first multiplying means and D/A converting means, and means for setting said data including an external memory means removably connected to said main unit.

11. An electronic sound source apparatus comprising;

a wave-form data output means for outputting wave-form data, said wave form data having a plurality of bits, means for producing amplitude data of a modulation envelope signal, means for outputting a time-width signal having time-width corresponding to said amplitude data, a D/A converter means for converting the wave-form data from said wave-form data output means into an analog signal, and an activating means for activating said D/A converter in response said time-width signal.

12. An electronic sound source apparatus in accordance with claim 11, wherein said activating means includes means for gating the wave-form data from said wave-form data output means by said time-width signal.

13. A sound source apparatus in accordance with claim 12, which further comprises a power source for applying DC voltage to said D/A converter, wherein said activating means includes means for activating and deactivating said power source in response to said time-width signal.

14. An electronic sound source apparatus in accordance with claim 12, wherein said activating means includes an analog switch which receives the output of said D/A converter, and is controlled by said time-width signal.

* * * * *

UNITED STATES PATENT AND TRADEMARK OFFICE
CERTIFICATE OF CORRECTION

PATENT NO. : 4,783,812
DATED : November 8, 1988
INVENTOR(S) : Yukio Kaneoka

It is certified that error appears in the above-identified patent and that said Letters Patent are hereby corrected as shown below:

In the Specification, Column 6, line 58 of the Patent, change "sin $w_m T$" to --sin $w_m t$--;

In Claim 1, Column 11, line 12 of the Patent, change (J(t)<B(t) (C+Sin $w_m t$)" to --(J(t) = B(t) (C+Sin $w_m t$))--.

Signed and Sealed this

Eighteenth Day of April, 1989

*Attest:*

DONALD J. QUIGG

*Attesting Officer* *Commissioner of Patents and Trademarks*